United States Patent [19]

Botez

[11] Patent Number: 5,101,413
[45] Date of Patent: Mar. 31, 1992

[54] LARGE-APERTURE LIGHT SOURCES USING RESONANT LEAKY-WAVE COUPLING

[75] Inventor: Dan Botez, Redondo Beach, Calif.
[73] Assignee: TRW Inc., Redondo Beach, Calif.
[21] Appl. No.: 698,049
[22] Filed: May 10, 1991
[51] Int. Cl.$^5$ ............................................. H01S 3/19
[52] U.S. Cl. ........................................ 372/50; 372/23; 372/45; 372/97; 372/103
[58] Field of Search ..................... 372/50, 45, 23, 97, 372/103, 43, 44

[56] References Cited

U.S. PATENT DOCUMENTS

| | | | |
|---|---|---|---|
| 4,063,189 | 12/1977 | Scifres et al. | 372/45 |
| 4,760,580 | 7/1988 | Thompson et al. | 372/50 |
| 4,764,935 | 8/1988 | Wilcox et al. | 372/50 |
| 4,852,113 | 7/1989 | Botez | 372/50 |
| 4,860,298 | 8/1989 | Botez et al. | 372/45 |
| 4,985,897 | 1/1991 | Botez et al. | 372/50 |

*Primary Examiner*—Georgia Epps
*Attorney, Agent, or Firm*—James M. Steinberger; Sol L. Goldstein

[57] ABSTRACT

Device coherency and optical-mode stability are obtained in light sources having large apertures and output powers, by using an important property of arrays of antiguides or negative-index waveguides. One embodiment of the invention is a power amplifier into which a light beam is input from a master oscillator. The input beam is introduced into one or more waveguides of an array, and leaks into successive adjacent waveguides, forming a fan-out pattern as it progresses along the array. The antiguides have an interelement spacing that is selected to produce a resonance effect, as a result of which light is coherently coupled to all waveguides in the array. The structure also provides lateral mode control and assures mode stability of the output. In the amplifier embodiment of the invention, the end faces of the array are antireflective coated and light makes only a single pass through the structure. The other disclosed embodiment is an injection-locked oscillator, but the same principle of leaky waveguides is used to provide a high degree of device coherency and mode stability. In this version, the array has reflective end faces and functions as a slave laser.

23 Claims, 3 Drawing Sheets

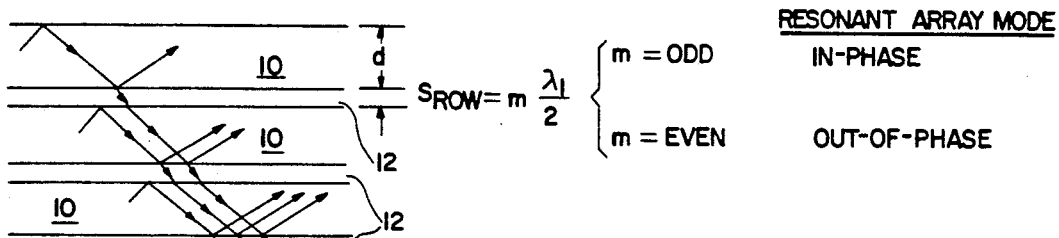
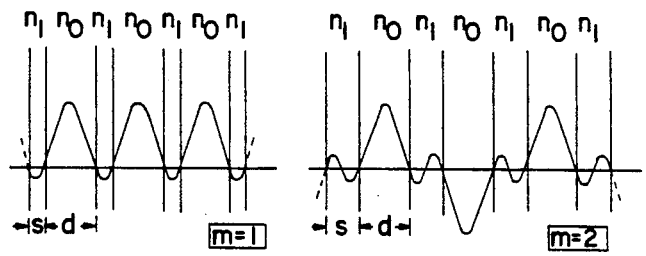
FIG.2a   FIG.2b
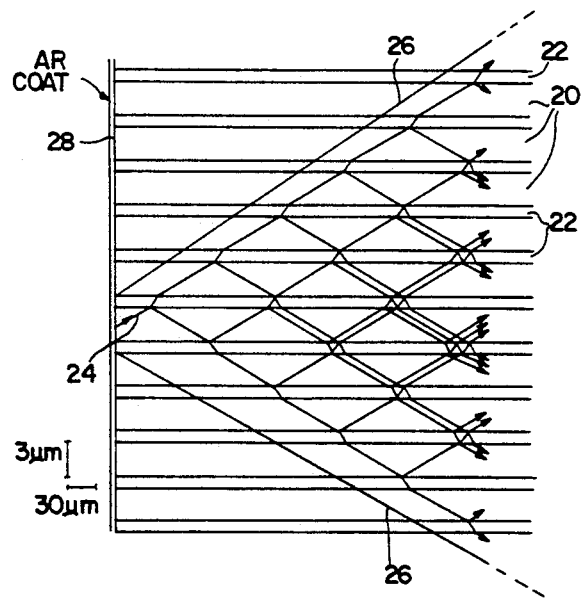
FIG.3

LARGE-APERTURE LIGHT SOURCES USING RESONANT LEAKY-WAVE COUPLING

BACKGROUND OF THE INVENTION

This invention relates generally to light sources having relatively large apertures and, more particularly, to semiconductor laser light sources having a large aperture and relatively high output power. Some applications of laser light sources, such as communications in space or high-density optical recording, require a relatively powerful light source from a wide aperture, but with full phase coherence across the aperture, and with optical-mode stability.

Briefly, by way of general background, a semiconductor diode laser includes a diode structure, having an n-type layer, a p-type layer, and an undoped active layer sandwiched between them. When this diode structure is electrically forward-biased in normal operation, electrons and holes from the n-type and p-type layers recombine in the active layer, and light is emitted. Cladding layers of appropriate index of refraction confine the light "transversely," in a direction perpendicular to the layers, and various techniques may be used to confine the light "laterally," i.e. in a direction perpendicular to a desired "longitudinal" direction of light output. Reflective facets are located at opposite ends of the structure, to reflect light back and forth in the longitudinal direction.

Single-element diode lasers are limited in power to outputs of the order of 30 milliwatts (mW), but arrays of diode lasers can be designed to provide output powers of hundreds of milliwatts. Developments in this area have in recent years been concerned with refinements in laser arrays, to produce beams of high output power and with desirable characteristics. For most high-power semiconductor laser applications there is a requirement for a diffraction-limited beam, i.e. one whose spatial spread is limited only by the diffraction of light, to a value roughly proportional to the wavelength of the emitted light divided by the width of the emitting source. Because of the requirement for a stable diffraction-limited beam, much research in the area has been directed to index-guided laser arrays, in which dielectric waveguides aligned in the longitudinal direction confine light in the lateral direction.

Most semiconductor structures employed for lateral index guiding in laser arrays are known as positive-index guides, i.e. the refractive index is highest in regions aligned with the laser elements and falls to a lower value in regions between the elements, thereby effectively trapping light within the laser elements. Another type of index guiding is referred to as negative-index guiding, or antiguiding, wherein the refractive index is lowest in the regions aligned with the laser elements and rises to a higher value between elements. Some of the light encountering the higher refractive index material will leak out of the lasing element regions; hence the term "leaky-mode" laser array is sometimes applied. The use of antiguides in laser arrays is disclosed in various patents and publications, for example U.S. Pat. No. 4,860,298 to Dan Botez et al., entitled "Phase-Locked Array of Semiconductor Lasers Using Closely Spaced Antiguides."

An important concept concerning laser arrays is that they may oscillate in one or more multiple possible configurations, known as array modes. In what is usually considered to the most desirable array mode, all of the emitters oscillate in phase. This is known as the fundamental or 0°-phase-shift array mode, and it produces a far-field pattern in which most of the energy is concentrated in a single lobe, the width of which is limited, ideally, only by the diffraction of light. When adjacent laser emitters are 180° out of phase, the array operates in the 180°-phaseshift array mode, or the out-of-phase array mode, and produces two relatively widely spaced lobes in the farfield distribution pattern. Multiple additional modes exist between these two extremes, depending on the phase alignment of the separate emitters, and in general there are N possible array modes for an N-element array. Many laser arrays operate in two or three array modes simultaneously and produce one or more beams that are typically two or three times wider than the diffraction limit.

It is usually a goal in the design of laser arrays to produce a beam that is stable in its mode of operation, even at high powers, since it is difficult to achieve a diffraction-limited beam if the array mode is subject to change. Such mode instability can result from changes in refractive index, which may be thermally or optically induced at higher powers. U.S. Pat. No. 4,985,897 to Botez et al., entitled "Semiconductor Laser Array Having High Power and High Beam Quality," discloses a laser array of antiguides that overcomes this difficulty by operating in a resonance condition, such that there is very strong coupling between the waveguides, and improved device coherence. The structure disclosed in U.S. Pat. No. 4,985,897 also affords improved control over, and stability of the mode of operation, and provides for various techniques for suppressing unwanted modes.

Some applications of laser light sources require relatively large output apertures, larger than those of laser arrays disclosed in the patents discussed above. Prior attempts to achieve high power outputs from large apertures have not been completely successful because of the difficulties of maintaining device coherence and optical-mode stability across the large aperture. Furthermore, phase coherence in arrays does not insure single-frequency operation. Some applications, such as coherent optical space communications, require a diffraction-limited beam as well as single-frequency operation. Two approaches have been commonly employed, and both make use of a highly monochromatic laser, as a master oscillator providing the primary source of radiation. In one approach, a master oscillator is coupled to a semiconductor power amplifier having a lateral dimension that flares out to provide the desired wide aperture. This combination is known as a master oscillator with power amplifier (MOPA). In the other common approach, a master oscillator is coupled to a large-aperture semiconductor laser, which then oscillates at the frequency of the master oscillator. This combination is known as an injection-locked oscillator (ILO).

Basically, the principal difference between these two configurations is that the power amplifier is a one-pass device. Light entering one end of the amplifier is amplified as it passes to the other end, which has a wider aperture. If the amplifier is simply a large pn junction region of diverging width, and no waveguide structure, phase coherence of the device is not usually a problem but there is little or no stability in the optical mode of the output. The power amplifier may alternatively be constructed as a diverging tree structure of waveguides.

Output from the master oscillator enters the amplifier through single waveguide and encounters a Y junction, which bifurcates the waveguide into two sections. These connect to additional Y junctions, from which additional waveguide sections connect to still more Y junctions, and so forth across the amplifier, with a large number of parallel waveguide sections producing output through a large aperture. In this version of the MOPA, mode stability is obtained but phase coherence is extremely difficult to control, because of the possible differences in the path lengths of the waveguide tree structure.

The injection-locked oscillator scheme works well only up to levels of 1.5 to 2.0 times threshold current in the laser, because above these levels a phenomenon known as gain spatial hole burning tends to spoil the mode purity of the laser. Again there is a need to control the optical mode in the plane of the junction (in the lateral direction) while maintaining full coherence across the aperture.

It will be appreciated from the foregoing that there is a need for a light source that overcomes the disadvantages discussed above, and which may be configured in various ways, such as a power amplifier or an injection-locked oscillator. The present invention satisfies this need.

SUMMARY OF THE INVENTION

The present invention resides in a light source having a relatively large output aperture and capable of maintaining device coherence and optical mode control, even at high output powers. Briefly, and in general terms, the light source of the invention comprises an array of negative-index waveguides, each waveguide having an antiguide core defining a waveguide element, and a laterally surrounding cladding material forming interelement regions, wherein the interelement spacing is selected to produce a resonance condition in which there is strong coupling between all elements of the array and a high degree of device coherence and optical mode stability. The light source further includes means for producing light amplification in the array, and means for introducing into at least one of the waveguide elements an input coherent light beam of selected frequency. The input light beam is fanned out naturally across the array by coupling through successive interelement regions in the resonance condition, and light is emitted from an output aperture extending across one end face of the waveguide array, after amplification in the array. The resonance condition is fulfilled when the interelement spacing is approximately equal to an odd number of half wavelengths of laterally traveling waves in the antiguide cladding material.

In one embodiment of the invention, the array of waveguides functions as a power amplifier, and further includes means for inhibiting reflections of light from end faces of the array. The means for producing light amplification in the array includes an electrical contact shaped to conform approximately with a fan-out shape formed by light from the input beam as it repeatedly couples to adjacent waveguides. Light from the input beam is amplified in a single pass through the array, which produces a highly device coherent output with optical-mode stability.

In the power amplifier form of the invention, the means for inhibiting reflections may take the form of antireflective coatings on the end faces of the array. Alternatively, the end faces may be angularly oriented to reflect light into a region of the array in which no amplification takes place. Preferably, the input light beam is derived from a master oscillator. The transition region between the master oscillator and the power amplifier can include a built-in diffraction grating, whose reflections represent feedback for the master oscillator, while transmitted light provides the input beam for the amplifier.

Operation of the power amplifier may be further enhanced by including a second array of antiguides and an interposed mixing region. The second array is spaced longitudinally from the first, and the waveguides in the first set are approximately aligned with interelement regions of the waveguides in the second set. The mixing region is laterally unguided and has a length approximately equal to an odd multiple of one half of the Talbot distance. This arrangement enhances mode control in the amplifier.

Another embodiment of the invention takes the form of an injection-locked oscillator. In this configuration, the array of antiguides includes means for encouraging internal reflections from end faces of the array, and an electrical contact covering substantially the entire area of the array. Light fanning out from the input beam is repeatedly reflected back and forth between the end faces of the array, as in a laser, but is locked to the frequency of the input light beam, and produces an amplified output beam from the large aperture, with a high degree of device coherence and mode stability. As in the power amplifier, operation of the injection-locked oscillator may be enhanced by use of one or more mixing regions, each positioned between two adjacent arrays of antiguides.

It will be appreciated from the foregoing that the present invention represents a significant advance in the field of coherent light sources, particularly semiconductor laser light sources having high power outputs and relatively large apertures. Specifically, the invention relates to an improvement in power amplifiers used in conjunction with master oscillators, or in injection-locked oscillators. Other aspects and advantages of the invention will become apparent from the following more detailed description, taken in conjunction with the accompanying drawings.

BRIEF DESCRIPTION OF THE DRAWINGS

FIG. 1 is a diagrammatic top view of three adjacent leaky-mode waveguides set in the array resonance condition;

FIGS. 2a and 2b are graphs showing the variation in field amplitude across the leaky-mode laser array of FIG. 1, for operation in the 0°-phase-shift array mode and the 180°-phase-shift array mode, respectively;

FIG. 3 is a diagrammatic top view of a leaky-mode array power amplifier in accordance with the present invention;

DESCRIPTION OF THE PREFERRED EMBODIMENTS

Figure 4:
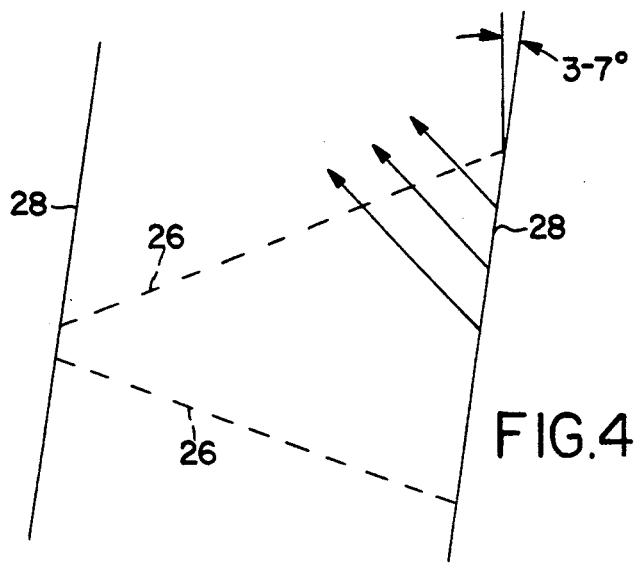
FIG. 4 is a diagrammatic top view of a variant of the power amplifier of FIG. 3, with a sloping end wall to prevent reflection back into the amplifier.

As shown in the drawings for purposes of illustration, the present invention is concerned with large-aperture light sources, particularly semiconductor light sources, which may take the form of either power amplifiers or injection-locked oscillators. Prior to the present invention, it has been difficult to maintain coherence and optical-mode stability across a large aperture in a light source having high power output.

In accordance with the present invention, the light source, whether it is a power amplifier or an injection-locked oscillator, includes an array of resonantly coupled antiguides, or leaky-mode waveguides. With appropriate selection of interelement spacing in the array, the leaky-mode waveguides assure both coherence and mode stability.

The principle of the resonant leaky-mode array is shown in diagrammatic form in FIG. 1, which depicts three adjacent waveguide core elements, indicated by reference numeral 10, separated by interelement regions 12. The effective refractive index of the interelement regions 12 is significantly higher than that of the waveguide core elements 10. Therefore, instead of the total internal reflection encountered in waveguides using positive-index guiding, light rays impinging on an interelement region 12 are partially refracted into the region. Moreover, if the width of the interelement region is appropriately selected, one hundred percent of the light refracted into the region is transmitted through it and into the adjacent waveguide core element 10.

The theoretical basis for selection of the interelement spacing to produce a resonant condition is discussed fully in U.S. Pat. No. 4,985,897. Briefly, a single leaky waveguide can be considered a source of travelling waves in the lateral direction, of wavelength $\lambda_l$ in the interelement regions. Constructive interference between standing waves from multiple antiguides occurs when the phase difference between codirectional waves leaked from successive antiguides is an integral multiple of $\pi$. The resonance condition for the 0°-phase-shift array mode is that the interelement spacing s must be approximately equal to an odd number of half-wavelengths, as illustrated in FIG. 2a. For the 180°-phase-shift array mode the interelement spacing must be approximately equal to an even number of half-wavelengths, as illustrated in FIG. 2b. In the resonance condition, each interelement region is equivalent to a Fabry-Perot resonator in the resonant condition. It will be seen from FIG. 2a that, for the resonance condition in which there are an odd number of half-wavelengths for the interelement spacing, the field amplitude is in phase in each of the waveguide elements of the array.

In accordance with the invention, this resonance principle is used in a power amplifier, as depicted in FIG. 3. The amplifier comprises a relatively large number of antiguides, some of which are shown in the figure. Waveguide core elements are indicated at 20 and interelement regions of higher refractive index are indicated at 22. Output from a master oscillator (not shown) having a desired frequency is coupled into one or more of the waveguide core elements 20 near the center of the array. The ray path of one wavefront from the master oscillator is indicated at 24. It will be observed that part of the energy of this ray will be repeatedly reflected from the adjacent interelement regions and will proceed through the same waveguide element in which the ray 24 was launched. However, at each point of reflection some of the energy of the ray is refracted through the adjacent interelement regions and is coupled to the adjacent waveguides. The same process occurs in the adjacent waveguides, with some energy remaining internally reflected and some being refracted to adjacent waveguides. The net effect of these reflections and refractions is that the energy "fans out" from the point at which the master oscillator is coupled into the amplifier. Moreover, because of the resonance condition, portions of the original ray that are recombined in any waveguide are still coherent in phase, and mode stability is maintained across the aperture.

The amplifier also includes a triangular contact area, indicated at 26, through which power is applied to the device. In FIG. 3 the fan-out angle is exaggerated because the scale of the drawing in the horizontal direction differs from that in the vertical direction by a factor of ten. The fan-out half angle is approximately the same as the angle of the ray inside the antiguide core. A typical value is 3°. For a 25-element array, with waveguide core elements 3 $\mu$m (micrometers) wide and interelement regions 1 $\mu$m wide, an emitting area 100 $\mu$m wide is obtained in a propagating distance of only 1.0 mm. This assures a coherent output power of 1-2 watts.

The ends of the amplifier array, only one of which is shown at 28, are coated with an antireflective material, preferably with a reflection coefficient of less than $10^{-3}$ to prevent reflective feedback. Alternatively, as shown in FIG. 4, the end facet or both facets of the amplifier may be angled at 3°-7° from a direction normal to the longitudinal axes of the antiguides. Thus any reflections will be into an unpumped region of the device, outside the area covered by the triangular contact area. If the master oscillator is to be monolithically integrated with the power amplifier, only reflections from the amplifier emitting region should be suppressed. Between the master oscillator and the front end of the amplifier, a built-in diffraction grating provides feedback for the master oscillator and input for the amplifier.

Figure 5:
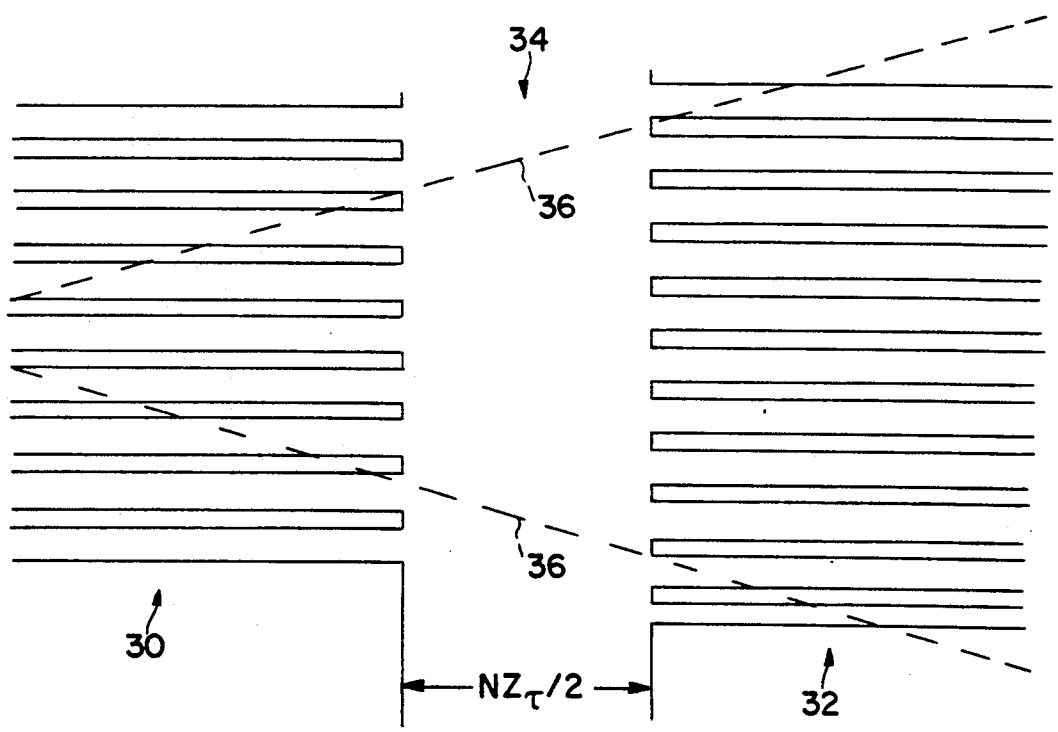
FIG. 5 is a diagrammatic top view of an alternative embodiment of the power amplifier of the invention, including a mixing region.

The foregoing description assumes that the resonance condition is achieved in the array interelement regions. If the resonance condition is only imperfectly achieved, full coherence across the amplifier can be aided by placing mixing regions in the body of the device, as illustrated in FIG. 5. This shows two antiguide arrays 30 and 32, separated by a mixing region 34, and laterally offset from each other such that the waveguide cores of one set are longitudinally aligned with the interelement regions of the other set. A triangular contact area 36 extends across both arrays 30 and 32, and the mixing region 34. The mixing region 34 allows free diffraction of the propagating mode, and is selected to have a length that is an odd number of half Talbot lengths.

As described in U.S. Pat. No. 4,985,897, the Talbot effect is a diffraction phenomenon first observed in the nineteenth century. When a number of light emitters of the same intensity and wavelength are periodically spaced in an array and the emissions are transmitted into a diffraction medium, the diffracted light recombines into images of the emitters at a plane located at a predictable distance from the array, known as the Talbot length. For the 0°-phase-shift array mode, emissions from the array 30 will be re-imaged at points midway between the original emitting elements, and at a distance equal to an odd number of half Talbot lengths into the diffraction medium. Thus emissions from the array 30 will be re-imaged into the array 32. On the other hand any radiation in the 180°-phaseshift array mode will be re-imaged at the interelement regions of the second array 32, and effectively suppressed. If the Talbot length is $Z_T$, the length of the mixing region should be $NZ_T/2$, where N is an odd integer. For better coupling between elements, N should be 3, 5 or 7.

The cross-sectional details of the power amplifier are not critical to the present invention. A suitable epitaxial structure using gallium arsenide as a substrate and as an active layer, and aluminum gallium arsenide as cladding layers, is described in the aforementioned U.S. Pat. No. 4,985,897. Other approaches, using epitaxial quantum well structures, are equally good alternatives. The only requirements are that the antiguide core regions be separated by interelement regions of suitably high refractive index, and that the widths of the interelement regions be accurately controlled to achieve the desired resonance condition.

Figure 6:
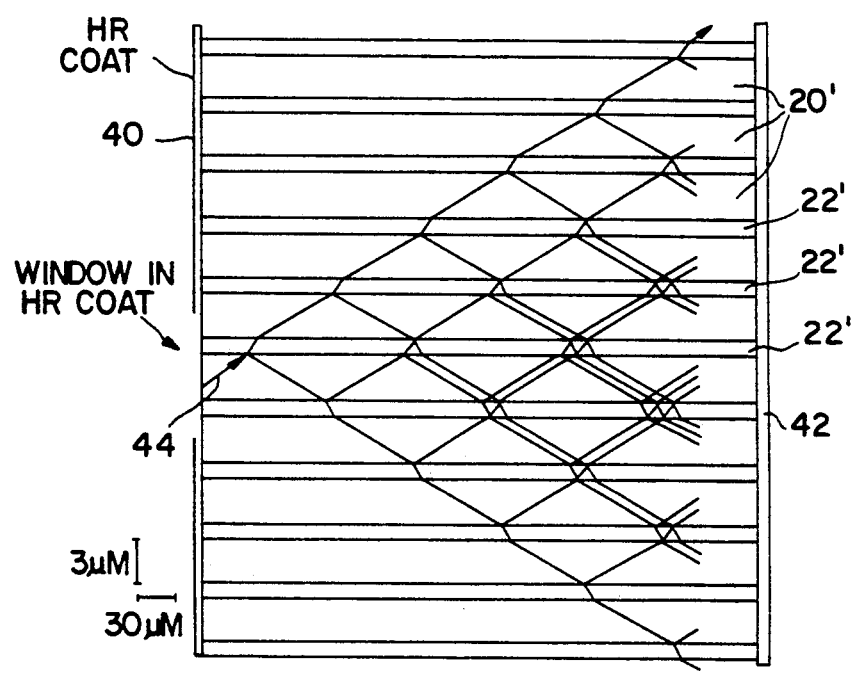
FIG. 6 is a diagrammatic top view of an injection-locked oscillator in accordance with the present invention.

An alternative structure for producing highpower output across a relatively large aperture is that of the injection-locked laser, shown in FIG. 6. This device includes an identical antiguide array to that of FIG. 3, including a set of parallel antiguide core elements 20' separated by interelement regions 22'. However, this device operates as a laser and includes a high-reflectivity coating on one end facet, as indicated at 40, and a low-reflectivity coating on the other end facet, as indicated at 42, through which light is emitted from the device. The injection-locked oscillator has no triangular contact area, but includes a contact area (not shown) extending over the entire top surface of the oscillator.

Energy from a master oscillator (not shown) is coupled into at least one central core element 20' through a window 43 in the high-reflectivity coating 40, and a typical ray of one wavefront from the oscillator is shown at 44. Basically, this ray is fanned out in exactly the same manner as in the power amplifier of FIG. 3. When the fanned out energy reaches the low-reflectivity coating, some of it is reflected back, and multiple fan-outs of the energy are effected on the return trip through the oscillator cavity. The oscillator is locked to the frequency of the injected energy at 44 and, because of the resonance effect, there is coherent coupling among all of the antiguide elements and mode stability across the aperture of the device.

The advantages of the injection-locked oscillator of the invention are that its lateral-mode control achieves stable single-lobe operation up to relatively high powers (in excess of 1.0 watt), and that the emitted beam is on-axis, i.e. perpendicular to the facet. As with the power amplifier, the injection-locked oscillator may use full coherence mixing regions having a length of an odd number of half Talbot lengths.

It will be understood from the foregoing that the present invention represents a significant advance in the field of high-power, large-aperture light sources, using either a master-oscillator-power-amplifier configuration or an injection-locked oscillator configuration. The invention provides a high degree of coherence and mode stability across its large aperture, and is therefore suitable for many applications, including laser communications in space, and high-density optical recording. It will also be appreciated that, although a number of embodiments of the invention have been described in detail for purposes of illustration, various modifications may be made without departing from the spirit and scope of the invention. In particular, although the invention has been described with specific reference to semiconductor lasers and power amplifiers, the principles of the invention may also be applied to other types of lasers and amplifiers employing leaky-type waveguides. Accordingly, the invention is not to be limited except as by the appended claims.

I claim:

1. A light source having a relatively large aperture, the light source comprising:
   an array of negative-index waveguides, each waveguide having an antiguide core defining a waveguide element, and a laterally surrounding cladding material forming interelement regions, wherein the interelement spacing is selected to produce a resonance condition in which there is strong coupling between all elements of the array and a high degree of device coherence and optical mode stability;
   means for producing light amplification in the array;
   means for introducing into at least one of the waveguide elements an input coherent light beam of selected frequency;
   wherein the input light beam is naturally fanned out across the array by coupling through successive interelement regions in the resonance condition;
   and wherein the array has an output aperture extending across the waveguides, and light is emitted through the aperture after amplification in the array.

2. A light source as defined in claim 1, wherein:
   the interelement spacing is selected to be approximately equal to an odd number of half wavelengths of laterally traveling waves in the antiguide cladding material.

3. A light source as defined in claim 1, wherein:
   the array of waveguides functions as a power amplifier;
   the array further includes means for inhibiting reflections of light from end faces of the array; and
   the means for producing light amplification in the array includes an electrical contact shaped to conform approximately with a fan-out shape formed by light from the input beam as it repeatedly couples to adjacent waveguides; and
   light from the input beam is amplified in a single pass through the array, which produces a highly device-coherent output with optical-mode stability.

4. A light source as defined in claim 3, wherein:
   the means for inhibiting reflections include antireflective coatings on the end faces of the array.

5. A light source as defined in claim 3, wherein:
   the means for inhibiting internal reflection includes end faces that are angularly oriented to reflect light into a region of the array in which no amplification takes place.

6. A light source as defined in claim 3, wherein:
   the means for introducing an input coherent light beam includes a master oscillator, and a monolithic diffraction grating providing feedback for the master oscillator and input light for the power amplifier.

7. A light source as defined in claim 3, and further comprising:
   a second array of negative-index waveguides spaced longitudinally from the first array, wherein the waveguides in the first set are approximately aligned with interelement regions of the waveguides in the second set; and a laterally unguided mixing region located between and coupled to the two arrays of negative-index waveguides, having a length approximately equal to an odd multiple of one half of the Talbot distance.

8. A light source as defined in claim 1, wherein:
the array of waveguides functions as an injection-locked oscillator;
the array further includes means for encouraging internal reflections from end faces of the array;
the means for producing light amplification in the array includes an electrical contact covering substantially the entire area of the array; and
light fanning out from the input beam is repeatedly reflected back and forth between the end faces of the array, is locked to the frequency of the input light beam, and produces an amplified output beam from the large aperture, with a high degree of device coherence and mode stability.

9. A light source as defined in claim 8, wherein:
the means for encouraging internal reflections includes a low-reflectivity coating on one end face containing the aperture, and a high-reflectivity coating on the other end face, with an opening to allow for light injection into the injection-locked oscillator.

10. A light source as defined in claim 8, wherein:
the means for introducing an input coherent light beam includes a master oscillator, and a monolithic diffraction grating providing feedback for the master oscillator and input light for the injection-locked oscillator.

11. A light source as defined in claim 8, and further comprising:
a second array of negative-index waveguides spaced longitudinally from the first array, wherein the waveguides in the first set are approximately aligned with interelement regions of the waveguides in the second set; and
a laterally unguided mixing region located between and coupled to the two arrays of negative-index waveguides, having a length approximately equal to an odd multiple of one half of the Talbot distance.

12. A semiconductor power amplifier having a relatively large aperture, comprising:
an array of negative-index waveguides, each waveguide having an antiguide core defining a waveguide element, and a laterally surrounding cladding material forming interelement regions, wherein the interelement spacing is selected to produce a resonance condition in which there is strong coupling between all elements of the array and a high degree of device coherence and optical mode stability;
means for producing light amplification in the array;
means for introducing into at least one of the waveguide elements an input coherent light beam of selected frequency; and
means for inhibiting internal reflection of light from end faces of the array;
wherein the input light beam is naturally fanned out across the array by coupling through successive interelement regions in the resonance condition;
and wherein the array has an output aperture extending across the waveguides, and light is emitted through the aperture after amplification during one pass through the array.

13. A semiconductor power amplifier as defined in claim 12, wherein:
the interelement spacing is selected to be approximately equal to an odd number of half wavelengths of laterally traveling waves in the antiguide cladding material.

14. A semiconductor power amplifier as defined in claim 13, wherein the means for producing light amplification in the array includes: 7, a substrate, an active semiconductor layer, and surrounding cladding layers formed on the substrate; and
a pair of electrical contacts formed on opposite faces of the substrate, one of which is shaped to conform approximately with a fan-out shape formed by light from the input beam as it repeatedly couples to adjacent waveguides.

15. A semiconductor power amplifier as defined in claim 14, wherein:
the means for inhibiting internal reflection includes antireflective coatings on the end faces of the array.

16. A semiconductor power amplifier as defined in claim 14, wherein:
the means for inhibiting internal reflection include end faces that are angularly oriented to reflect light into a region of the array in which no amplification takes place.

17. A semiconductor power amplifier as defined in claim 12, wherein:
the means for introducing an input coherent light beam includes a master oscillator, and a monolithic diffraction grating providing feedback for the master oscillator and input light for the power amplifier.

18. A semiconductor power amplifier as defined in claim 15, and further comprising:
a second array of negative-index waveguides spaced longitudinally from the first array, wherein the waveguides in the first set are approximately aligned with interelement regions of the waveguides in the second set; and
a laterally unguided mixing region located between and coupled to the two arrays of negative-index waveguides, having a length approximately equal to an odd multiple of one half of the Talbot distance.

19. A semiconductor injection-locked oscillator having a relatively large output aperture, comprising:
an array of negative-index waveguides, each waveguide having an antiguide core defining a waveguide element, and a laterally surrounding cladding material forming interelement regions, wherein the interelement spacing is selected to produce a resonance condition in which there is strong coupling between all elements of the array and a high degree of device coherence and optical mode stability;
means for producing light amplification and lasing in the array;
means for introducing into at least one of the waveguide elements an input coherent light beam of selected frequency;
means for encouraging internal reflections from end faces of the array; and
wherein the interelement spacing is selected to be approximately equal to an odd number of half wavelengths of laterally traveling waves in the antiguide cladding material;

and wherein the input light beam is naturally fanned out across the array by coupling through successive interelement regions in the resonance condition;

and wherein the array has an output aperture extending across the waveguides, and light is emitted through the aperture after amplification in the array.

20. A semiconductor injection-locked oscillator as defined in claim 19, wherein:

the means for producing light amplification and lasing in the array includes a substrate, an active semiconductor layer, and surrounding cladding layers formed on the substrate, and a pair of electrical contacts formed on opposite faces of the substrate, one of which is shaped to cover substantially the entire area of the array; and light fanning out from the input beam is repeatedly reflected back and forth between the end faces of the array, is locked to the frequency of the input light beam, and produces an amplified output beam from the large aperture, with a high degree of device coherence and mode stability.

21. A semiconductor injection-locked oscillator as defined in claim 19, wherein:

the means for encouraging internal reflections includes a low-reflectivity coating on one end face containing the aperture, and a high-reflectivity coating on the other end face, with an opening allowing for injection of light into the injection-locked oscillator.

22. A semiconductor injection-locked oscillator as defined in claim 19, wherein:

the means for introducing an input coherent light beam includes a master oscillator, and a monolithic diffraction grating providing feedback for the master oscillator and input light for the injection-locked oscillator.

23. A semiconductor injection-locked oscillator as defined in claim 19, and further comprising:

a second array of negative-index waveguides spaced longitudinally from the first array, wherein the waveguides in the first set are approximately aligned with interelement regions of the waveguides in the second set; and a laterally unguided mixing region located between and coupled to the two arrays of negative-index waveguides, having a length approximately equal to an odd multiple of one half of the Talbot distance.

* * * * *